(12) United States Patent
Masenten et al.

(10) Patent No.: US 7,173,980 B2
(45) Date of Patent: Feb. 6, 2007

(54) COMPLEX-IF DIGITAL RECEIVER

(75) Inventors: Wesley K. Masenten, Irvine, CA (US);
Keith Soo Hoo, Long Beach, CA (US);
Peter Stubberud, Henderson, NV (US);
Thang Victor Dinh, Westminster, CA (US); Elias Dagher, Aliso Viejo, CA (US)

(73) Assignee: DiTrans IP, Inc., Menlo Park, CA (US)

( * ) Notice: Subject to any disclaimer, the term of this patent is extended or adjusted under 35 U.S.C. 154(b) by 60 days.

(21) Appl. No.: 10/251,663

(22) Filed: Sep. 20, 2002

(65) Prior Publication Data

US 2004/0057534 A1    Mar. 25, 2004

(51) Int. Cl.
*H04L 27/06* (2006.01)
(52) U.S. Cl. .................................................. 375/316
(58) Field of Classification Search ................ 375/316, 375/261, 324, 328, 332, 350
See application file for complete search history.

(56) References Cited

U.S. PATENT DOCUMENTS

| | | | | |
|---|---|---|---|---|
| 5,003,621 A | * | 3/1991 | Gailus | 455/209 |
| 5,557,642 A | | 9/1996 | Williams | 375/316 |
| 5,640,698 A | | 6/1997 | Shen et al. | 455/323 |
| 5,729,230 A | | 3/1998 | Jensen et al. | 341/143 |
| 5,757,867 A | * | 5/1998 | Caulfield et al. | 375/350 |
| 5,982,315 A | * | 11/1999 | Bazarjani et al. | 341/143 |
| 6,005,506 A | * | 12/1999 | Bazarjani et al. | 341/143 |
| 6,064,871 A | * | 5/2000 | Leung | 455/323 |
| 6,094,458 A | * | 7/2000 | Hellberg | 375/242 |
| 6,243,430 B1 | * | 6/2001 | Mathe | 375/346 |
| 6,356,594 B1 | * | 3/2002 | Clement et al. | 375/261 |
| 6,366,622 B1 | * | 4/2002 | Brown et al. | 375/322 |
| 6,393,070 B1 | * | 5/2002 | Reber | 375/340 |
| 6,421,534 B1 | * | 7/2002 | Cook et al. | 455/313 |
| 6,429,797 B1 | * | 8/2002 | Wu | 341/143 |
| 6,459,743 B1 | * | 10/2002 | Lipka | 375/329 |
| 6,545,728 B1 | * | 4/2003 | Patel et al. | 348/725 |
| 6,560,294 B1 | * | 5/2003 | Gatherer | 375/261 |

(Continued)

OTHER PUBLICATIONS

Schreier at al., "A Flexible 10-300 MHz Receiver IC Employing a Bandpass Sigma-Delta ADC", Radio Frequency Integrated Circuits Symposium, 2001. Digest of Papers. 2001 IEEE, May 20-22, 2001, pp. 71-74.*

(Continued)

*Primary Examiner*—Chieh M. Fan
*Assistant Examiner*—Dung X. Nguyen
(74) *Attorney, Agent, or Firm*—Orrick Herrington & Sutcliffe LLP

(57) ABSTRACT

An improved complex-IF digital receiver has various improvements. The improved complex-IF digital receiver, for single or dual band applications, preferably synchronizes all of the signals to each other, which may be an integer multiple of each other. For example, the decimation filter, delta-sigma modulator, sensitivity DAC, and other circuits in the receiver can be synchronized. The delta-sigma modulator preferably includes a comparator whose input is coupled to a sensitivity DAC or synchronous dithering circuit. Ideally, the sensitivity DAC forces the comparator to trigger at every clock cycle and reduces the effect of hysteresis and offset at the input of the comparator. The receiver includes a translation circuit that translates an intermediate frequency signal to baseband, where the translation circuit preferably operates a translation ratio that is a multiple of 4.

16 Claims, 11 Drawing Sheets

U.S. PATENT DOCUMENTS

| | | | |
|---|---|---|---|
| 6,577,258 B2 * | 6/2003 | Ruha et al. | 341/143 |
| 6,590,943 B1 * | 7/2003 | Ali | 375/332 |
| 6,611,569 B1 * | 8/2003 | Schier et al. | 375/322 |
| 6,611,570 B1 * | 8/2003 | Subramanian | 375/326 |
| 6,654,594 B1 * | 11/2003 | Hughes et al. | 455/245.1 |
| 6,670,938 B1 * | 12/2003 | Yoshida | 345/98 |
| 6,954,628 B2 * | 10/2005 | Minnis et al. | 455/324 |
| 2004/0041623 A1 * | 3/2004 | Andrews | 327/538 |

OTHER PUBLICATIONS

Candy, JC et al., Oversampling Delta-Sigma Data Converters, IEEE Press, New York, 1992, pp. 1-29.

Cherry, JA et al., Clock Jitter and Quantizer Metastability in Continuous-Time Delta-Sigma Modulators, IEEE Transactions on Circuits and Systems—II: Analog and Digital Signal Processing, vol. 46, No. 6, Jun. 1999, pp. 661-676.

Cherry, JA et al., Excess Loop Delay in Continuous-Time Delta-Sigma Modulators, IEEE Transactions on Circuits and Systems—II: Analog and Digital Signal Processing, vol. 46, No. 4, Apr. 1999, pp. 376-389.

Crochiere, RE et al., Multirate Digital Signal Processing, Prentice-Hall Inc., Englewood Cliffs, N.J., 1983, pp. 143-183.

Horstman, JU et al., Metastability Behavior of CMOS ASIC Flip-flops in Theory and Test, IEEE Journal of Solid-State Circuits, vol. 24, No. 1, Feb. 1989, pp. 146-157.

Jensen, JF et al., A 3.2-GHZ Second-Order Delta_Sigma Modulator Implemented in InP HBT Technology, IEEE Journal of Solid-State Circuits, vol. 30, No. 10, Oct. 1995, pp. 1119-1127.

Norsworthy, SR, et al., Delta-Sigma Data Converters Theory, Design, and Simulation, IEEE Press, New York, 1997.

Proakis, JG et al., Advanced Digital Signal Processing, Macmillan Publishing Co., New York, 1992, pp. 142-151.

Razavi, B., Considerations for Direct-Conversion Receivers, IEEE Transactions on Circuits and Systems—II: Analog and Digital Signal Processing, vol. 44, No. 6, Jun. 1997, pp. 428-435.

* cited by examiner

COMPLEX-IF DIGITAL RECEIVER

BACKGROUND OF THE INVENTION

1. Field of the Invention

The field of the invention is wireless communications and more particularly, is receivers utilized for signal reception in a wireless communication system.

2. Background

Wireless systems are becoming a fundamental mode of telecommunication in modern society. In response to increasing market demand, the existing analog system, Advance Mobile Phone Service (AMPS), is being augmented with systems based upon digital modulation schemes, such as code division multiple access (CDMA), the Global System for Mobile (GSM), and 3rd Generation (3G) follow-on protocols. As deployment of these systems is not uniform either with respect to frequency band or geographic coverage, there is a need for a receiver that is capable of handling communication over more than one of these standardized protocols or bands so as to provide connectivity when geographically roaming. In order to achieve this, it is desirable to have a receiver that is capable of receiving signals which have been modulated according to several different modulation techniques and or frequency bands, such as, providing CDMA or GSM connectivity for both the Cellular and Digital Frequency Bands and also providing AMPS connectivity.

Most existing receivers are implemented using double conversion receiver architectures. A double conversion receiver architecture is characterized in that the received RF signal is converted to a real IF signal and this IF signal is subsequently converted to baseband. However, these double conversion receivers have the disadvantage of utilizing a great number of circuit components such as narrowband IF filters, thereby increasing the cost, size and power consumption of the receiver. In addition, gain control is also typically applied at the IF which adds complexity and desensitizes the receiver.

A direct conversion receiver provides an alternative to the traditional double down conversion architecture. Direct conversion is characterized in that the received signal is converted directly from the radio frequency at which it is received to baseband. One such technique was disclosed by Williams in U.S. Pat. No. 5,557,642 entitled "Direct Conversion Receiver For Multiple Protocols." In direct conversion, an antenna receives RF signals that have been digitally modulated according to a predetermined standard. The output of the antenna is passed to a low noise amplifier (LNA). The LNA amplifies the incoming signal. The output of the LNA is coupled to an automatic gain control (AGC) and filtering block. An automatic gain control and filtering block controls the magnitude and spectral content of the received signal. The output of the automatic gain control and filtering block is coupled to an amplifier that further amplifies the signal. The output from the amplifier is input into a sample and hold circuit. The sample and hold circuit is clocked by a first clock having a frequency f1. The output of the sample and hold circuit comprises a series of copies of the modulated signal centered about multiples of the clock frequency f1. The output of the sample and hold circuit is coupled to an oversampling delta-sigma converter. The delta-sigma converter receives a second clock having a frequency, f2, which is an integer multiple of the frequency f1. In this way, the delta-sigma converter loop oversamples the output signal provided by the sample and hold circuit. Thus, after decimation filtering, it provides a quantized representation of the modulated signal.

The inclusion of the sample and hold circuit, however, generates unneeded multiple spectral harmonic replicas of the signal since only one is utilized, which both add to the power and increase interference. In addition, the construction of the sample and hold circuit requires the use of high frequency circuit elements and design techniques to minimize the effects of sampling jitter and the resultant undesirable modulation of the signal even when the subsampling frequency is relatively low. For example, if a 2 GHz carrier signal is subsampled with a modest 200 MHz clock, the aperture time during which the sample and hold circuit samples the signal must be on the order of several picoseconds in order to avoid significant distortion and "droop" of the sampled signal. The sample and hold circuit is typically implemented using some combination of diodes, FET switches or operational amplifiers that typically only operate sufficiently linearly over a small portion of their overall functional voltage range. In addition, the use of subsampling reduces the oversampling ratio that would be achieved by sampling at the carrier frequency or higher thereby significantly reducing the dynamic range of the delta-sigma converter loop. For example, the resolution of a delta-sigma converter is dependent upon the oversampling ratio. First, second, third, and fourth order delta-sigma converters optimally achieve 1.5, 2.5, 3.5, and 4.5 bits of resolution per octave of oversampling ratio, respectively. For example, using 200 MHz sampling clock, the Williams' architecture sacrifices 4.98 bits of resolution (30 decibels (dB)), 8.30 bits of resolution (50 dB), and 11.63 bits of resolution (70 dB), for first, second, and third order delta-sigma converters, respectively, as compared to sampling at the carrier frequency.

Recognizing that in a typical system application with a dynamic range requirement of 90 dB or greater, the dynamic range over which the input signal varies is larger than the dynamic range over which subsequent elements, such as the sample and hold circuit and delta-sigma loop, can operate, Williams inserted the AGC and filter circuit before the sample and hold circuit. The filter itself is typically implemented using of discrete analog components, which further increases the size and cost of the receiver. Finally, the inclusion of automatic gain control creates a DC offset error that is a function of the automatic gain control.

A similar prior art approach to implementing a RF communications receiver is described in Shen et al. U.S. Pat. No. 5,640,698. In Shen's method, the RF signal is band limited by a RF filter after which it is amplified and further noise filtered to avoid aliasing the LNA noise into the signal channel. The output of the noise filter is then inputted into a sample and hold circuit whose sampling rate is selected so that it sub-samples the RF signal in such a manner that the signal band is translated to a discrete-time image frequency. This discrete-time image frequency is successively further down sampled, anti-alias filtered and amplified to yield a low frequency discrete-time signal containing a down-converted channel of frequencies that contain the frequency of interest. This resultant low frequency discrete-time signal is then digitized in an analog to digital converter, filtered, and demodulated to reveal its baseband information. Salient features of the sub-sampling approach are an extensive use of narrowband analog RF, IF, or lowpass filters; multiple stages of analog conversion and amplification that limit dynamic range to that of traditional multiple down-conversion receivers; a low sampling rate; use of an approximate or exact sub-harmonic of signal carrier; a single ADC at IF that is sufficiently high to avoid images; and potential problems with sample and hold jitter.

An alternate approach to direct conversion was proposed in a co-pending patent application, U.S. patent application Ser. No. 09/339,063, by Wes Masenten and Ron Hickling, titled "DIRECT CONVERSION SIGMA-DELTA RECEIVER" and filed on Jun. 23, 1999. This alternative radio receiver directly converts a RF modulated carrier signal to a digital representation of the modulating signal. The receiver concurrently translates the RF modulated carrier signal to baseband using a commutator and digitizes the translated signal. The resultant receiver replaces the traditional double down conversion receiver and its associated analog filters with a direct down-conversion implementation.

Hence, the prior art receivers, such as traditional double down conversion receivers, have limitations that affect their performance. For example, the prior art receivers often suffer from a narrow dynamic range, thus requiring the inclusion of separate circuitry to cover multiple bands, automatic gain control circuits, and off-substrate filtering. Therefore, there is a need for an improved receiver.

SUMMARY OF THE INVENTION

In an example embodiment, the improved complex-IF digital receiver, for single or dual band applications, includes a mixer for translating a RF signal to an IF signal, an IF filter, a delta-sigma modulator, a decimation filter, and a translator circuit for translating the IF signal to baseband. The improved complex-IF digital receiver has a number of improvements. For example, the improved complex-IF digital receiver may include an IF filter as a resonator shared with the mixer and the delta-sigma modulator. As another example, the receiver preferably synchronizes all of the signals to a clock or an integer multiple of the clock so that the delta-sigma modulator, sensitivity DAC, decimation filter, and other circuits in the receiver can be synchronized. The clock to the decimation filter is preferably synchronized to an integer multiple or submultiple of the local oscillator frequency, which reduces noise and DC offset. As yet another example, the delta-sigma modulator preferably includes a comparator whose input is coupled to a sensitivity DAC or synchronous dithering circuit. Ideally, the sensitivity DAC forces the comparator to trigger at every clock cycle and reduces the effect of hysteresis and offset at the input of the comparator. The receiver preferably may include a translation circuit that is simplified by operating a translation ratio that is a multiple of 4, but may be any other integer.

Other systems, methods, features and advantages of the invention will be or will become apparent to one with skill in the art upon examination of the following figures and detailed description. It is intended that all such additional systems, methods, features and advantages be included within this description, be within the scope of the invention, and be protected by the accompanying claims.

BRIEF DESCRIPTION OF THE DRAWINGS

The components in the figures are not necessarily to scale, emphasis instead being placed upon illustrating the principles of the invention. Moreover, in the figures, like reference numerals designate corresponding parts throughout the different views. However, like parts do not always have like reference numerals. Moreover, all illustrations are intended to convey concepts, where relative sizes, shapes and other detailed attributes may be illustrated schematically rather than literally or precisely.

DETAILED DESCRIPTION OF THE PREFERRED EMBODIMENTS

Figure 1:
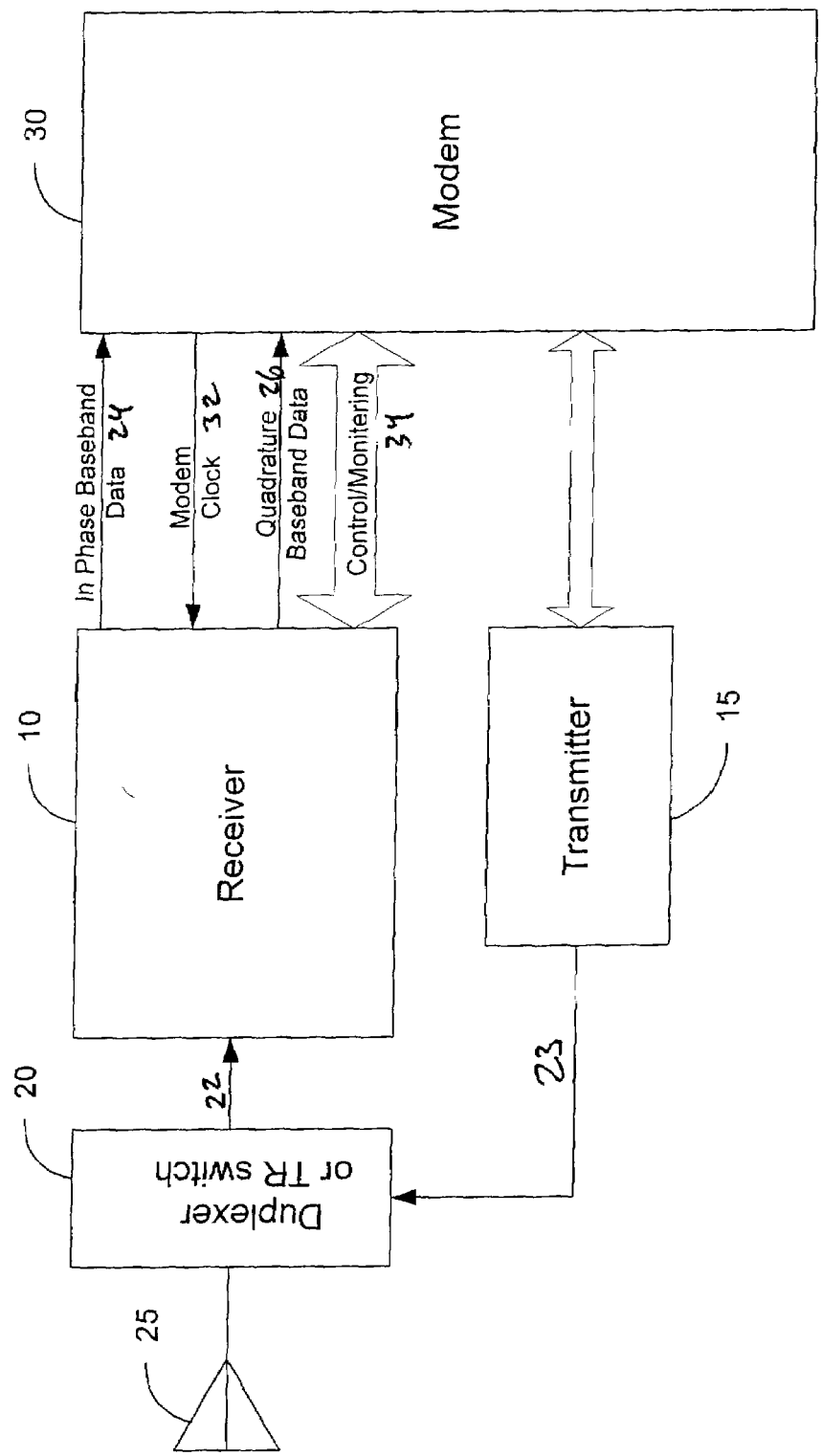
FIG. 1 is a schematic block diagram representation of an example embodiment of a single band application of an improved complex-IF digital receiver.

FIG. 1 is a schematic block diagram representation of an example embodiment of a single band application of an improved complex-IF digital receiver. High frequency signals are received through an antenna 25 and inputted to a duplexer 20. For example, in a personal communication system (PCS) application, the high frequency signal is a digitally modulated RF signal centered about a carrier frequency of approximately 1.8 to 2 gigahertz (GHz). The duplexer 20 couples the receive signal 22 to the receiver 10 and couples transmit signals 23 from the transmitter 15 to the antenna 25. The duplexer 20 includes a receiver bandpass filter (not shown) to prevent aliasing out-of-band signals (including the transmit signal) and noise power into the receive signal band of interest. The out-of-band rejection requirements of the bandpass filter are not stringent because the bandpass filter is, for example, only required to function as an anti-aliasing filter with a sample folding frequency approximately equal to the signal carrier frequency for Low-Band (Cellular Band) applications or one half the signal carrier frequency for High-Band (PCS band) applications and, concurrently, with enough rejection of the transmit signal to prevent the transmit signal as seen by the receiver from exceeding the receiver's dynamic range. The bandpass filter does not attempt to reject adjacent channel interference, which is performed by follow-on digital filtering in the receiver 10.

The duplexer 20 may be replaced by a transmit-receive (TR) switch in applications for which the receive signal and the transmit signal are spaced apart in time, such as in time division multiple access (TDMA) applications. In this application, the TR switch switches the antenna 25 between the receiver 10 and the transmitter 15 so that the antenna 25 is only coupled to one of them at a time.

Figure 2:
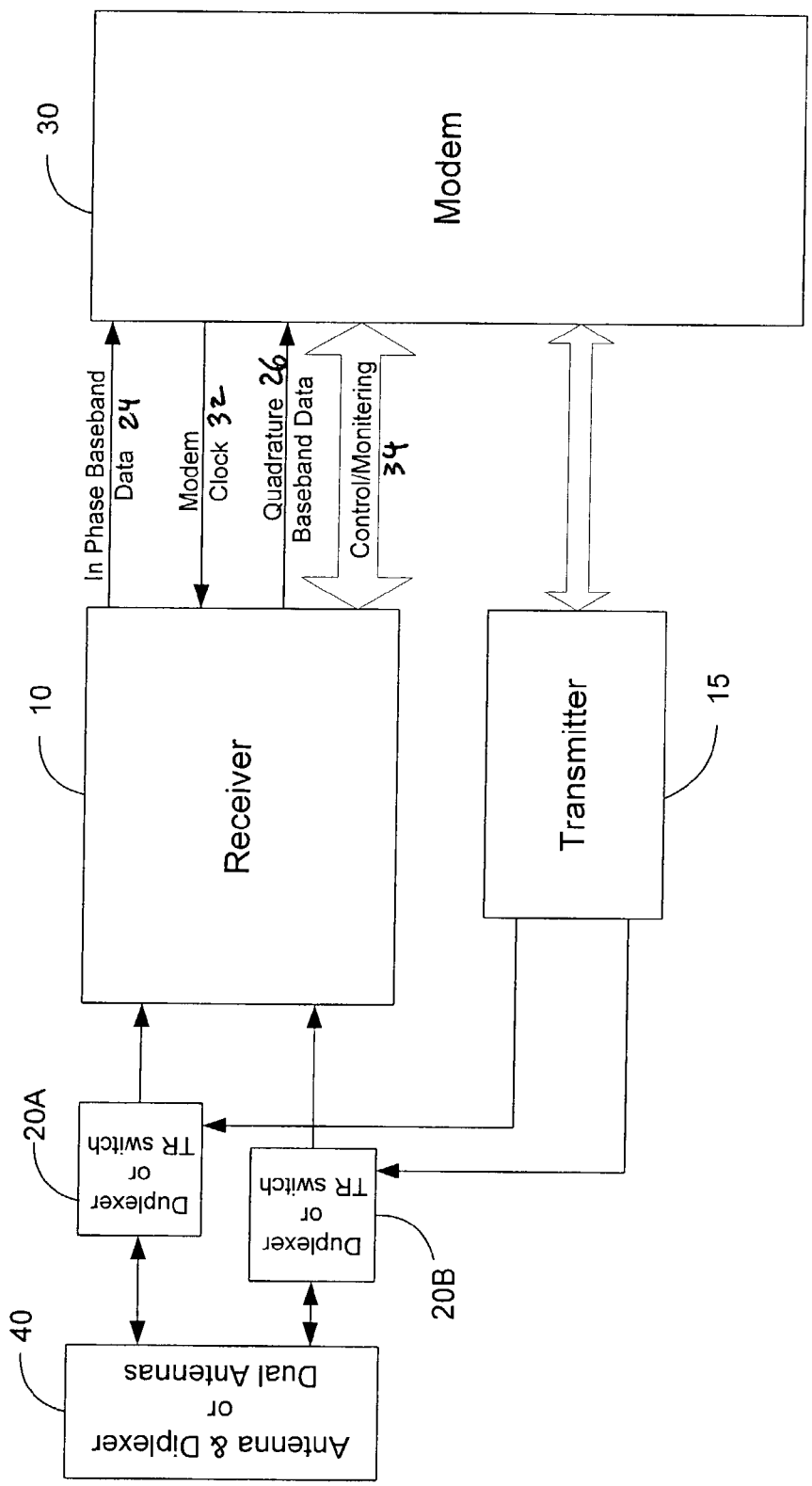
FIG. 2 is a schematic block diagram representation of an example embodiment of a dual band application of an improved complex-IF digital receiver.

FIG. 2 is a schematic block diagram representation of an example embodiment of a dual band application of an improved complex-IF digital receiver. In this application, the receiver 10 is able to receive signals in two different frequency bands. For example, one band may be a Low-Band (Cellular Band) and the other may be a High-Band (PSC). In this application, a duplexer 20A and 20B is assigned to each of the bands for coupling receive signals in the band to the receiver 10. The duplexers 20A and 20B may be coupled to a single antenna by a dual band diplexer 40 that routes receive signals in one band to duplexer 20A and receive signals in the other band to duplexer 20B. Alternatively, the duplexers 20A and 20B may be coupled to dual antennas (not illustrated).

The receiver 10 converts the received RF signal into in-phase and quadrature baseband data signals 24, 26, which are inputted to a modem 30. The operation of the receiver 10 is explained more fully below. The modem 30 provides digital demodulation of the baseband data signals 24 and 26, frequency control and signal clocks 34, as well as, other digital signal processing and control functions. Specifically, the modem 30 provides to the receiver 10 a modem clock signal 32 and a frequency control signal 34 to tune the receiver, as explained further below.

Figure 3:
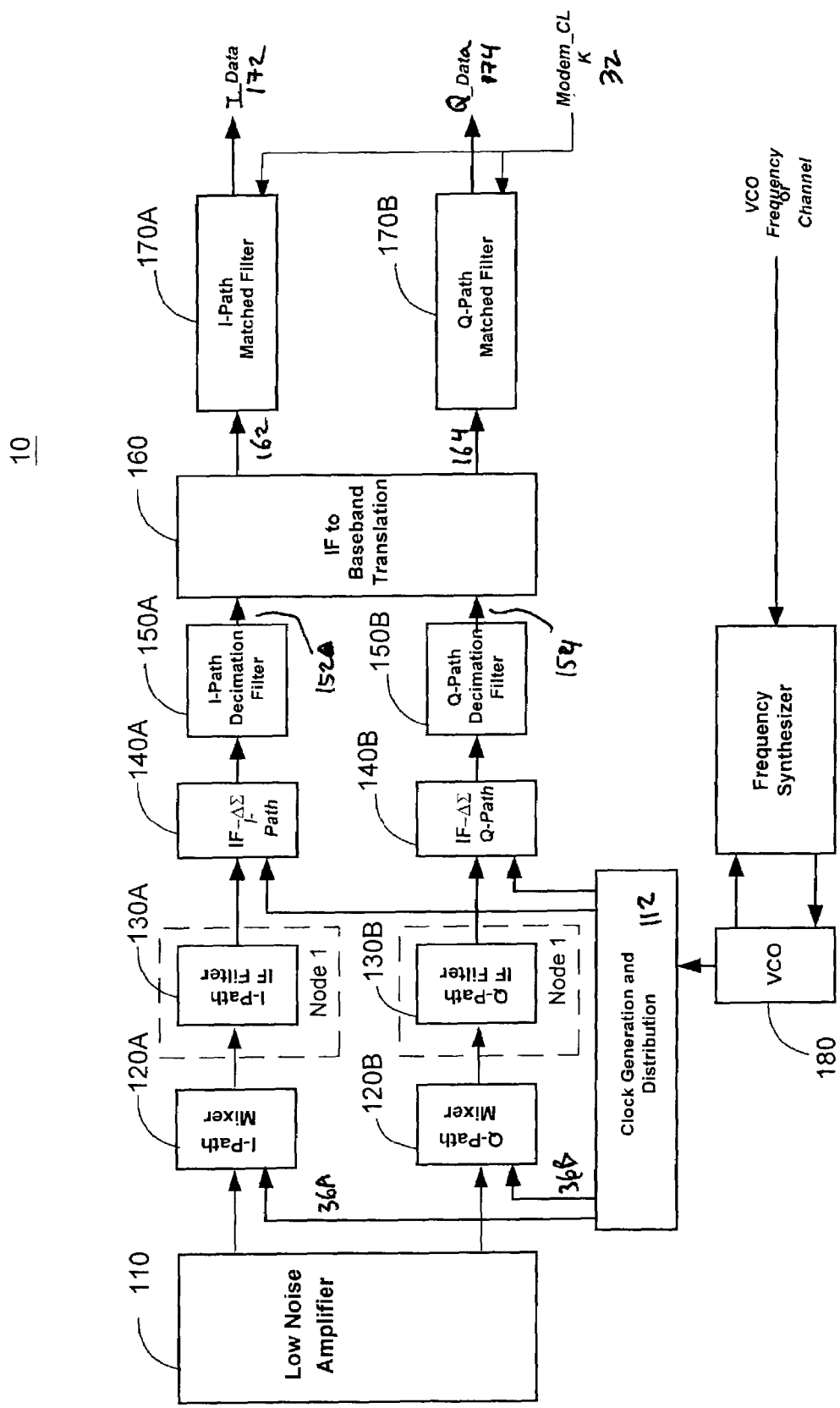
FIG. 3 is a block diagram of an example embodiment of a receiver.

FIG. 3 shows a preferred embodiment of the receiver 10. The receiver 10 includes an integrated low noise amplifier (LNA) 110 which may utilize one broadband or multiple narrow band low noise amplifiers (LNAs) for amplifying received RF signals. To establish the receiver's noise figure only one LNA is active at a time. The output of the active LNA is inputted to an in-phase (I)-path mixer 120A and quadrature (Q)-path mixer 120B, each of whose function is to translate the center frequency of the desired RF signal by a local oscillator frequency, fLO, to an intermediate frequency, fIF, as shown in FIGS. 4a and 4b.

Figure 4A:
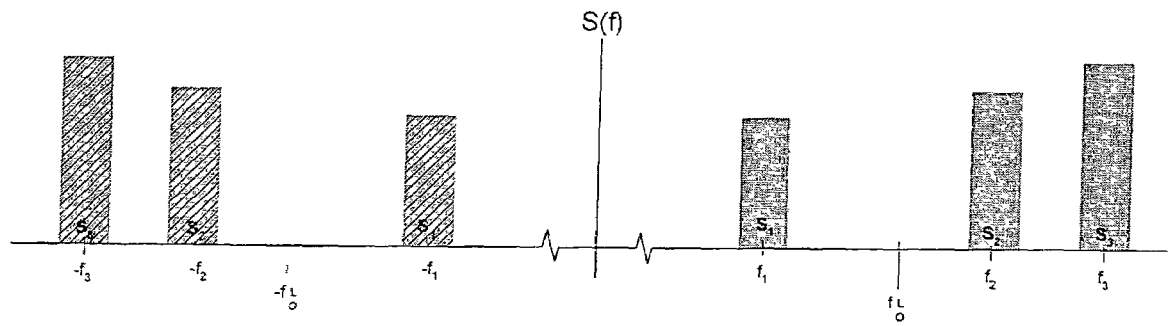
FIGS. 4A–4D are complex spectral power density plots illustrating a signal of interest, S2, and other signals at various points in the receiver of FIG. 3.
Figure 4B:
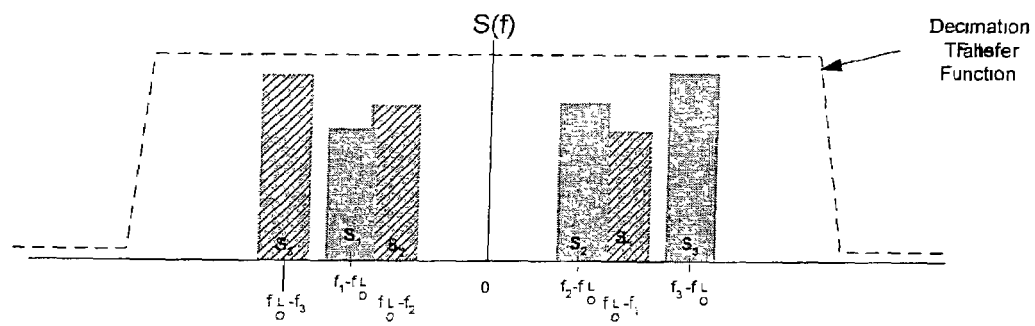

FIG. 4a shows an exemplary desired signal band given by S2 centered around a RF frequency of f2 before translation. FIG. 4b shows the desired signal band translated to the intermediate frequency, fIF, where fIF=f2−fLO. Each mixer 120A and 120B translates the received signal to the intermediate frequency by mixing the received signal with a local oscillation signal having a frequency of fLO derived from a voltage controlled oscillator (VCO) 180.

The mixers 120A and 120B also decompose the received signal into in-phase and quadrature components. To this end, the I mixer 120A outputs the in-phase component of the received signal at the IF and the Q mixer 120B outputs the quadrature component of the received signal at the IF. This may be accomplished by creating a 90 degree phase shift between the local oscillator signal 36A of the I mixer 120A and the local oscillator signal 36B of the Q mixer 120B.

The in-phase and quadrature components of the signal are separately received using an in-phase signal path and a quadrature signal path, respectively. The implementations of the in-phase and quadrature paths are alike and, thus, an understanding of one path leads to an understanding of the other path.

The output of each mixer 120A, 120B is coupled to a delta-sigma (ΔΣ) modulator 140A, 140B respectively through Node 1, which functions as both the output load of the mixer 140A, 140B and an input Node of the delta-sigma modulator 140A, 140B. In one example embodiment, Node 1 is implemented as an IF filter 130A (130B) that provide both a tuned output for the corresponding mixer 120A (120B) and a bandpass centered at the IF frequency for the first stage of the corresponding delta-sigma modulator 140A (140B). The IF filters 130A and 130B can be implemented using a variety of circuits, including resonator circuits.

Figure 6A:
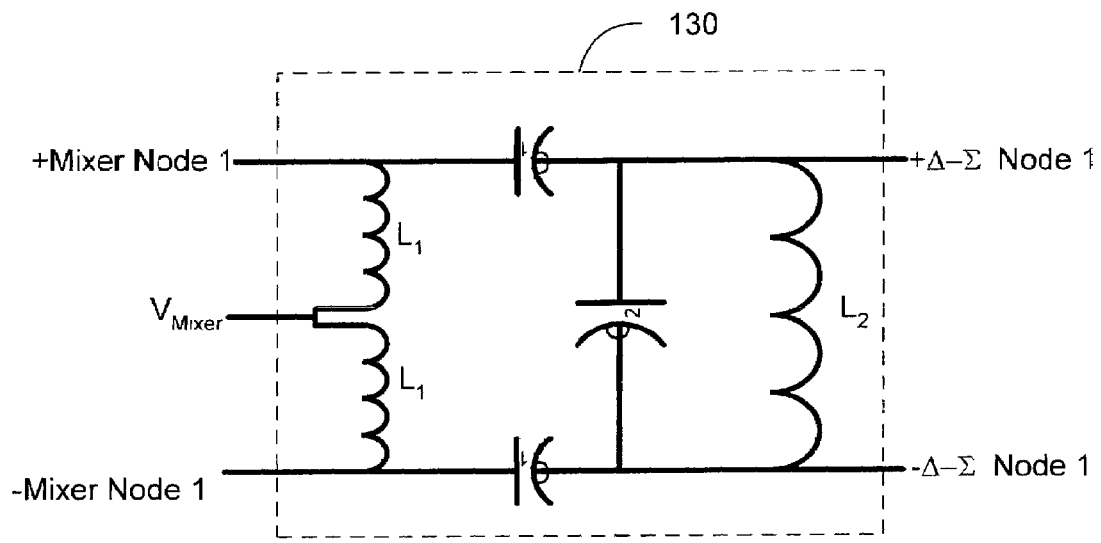
FIGS. 6A–6C illustrate example embodiments of IF filters or resonators.
Figure 6B:
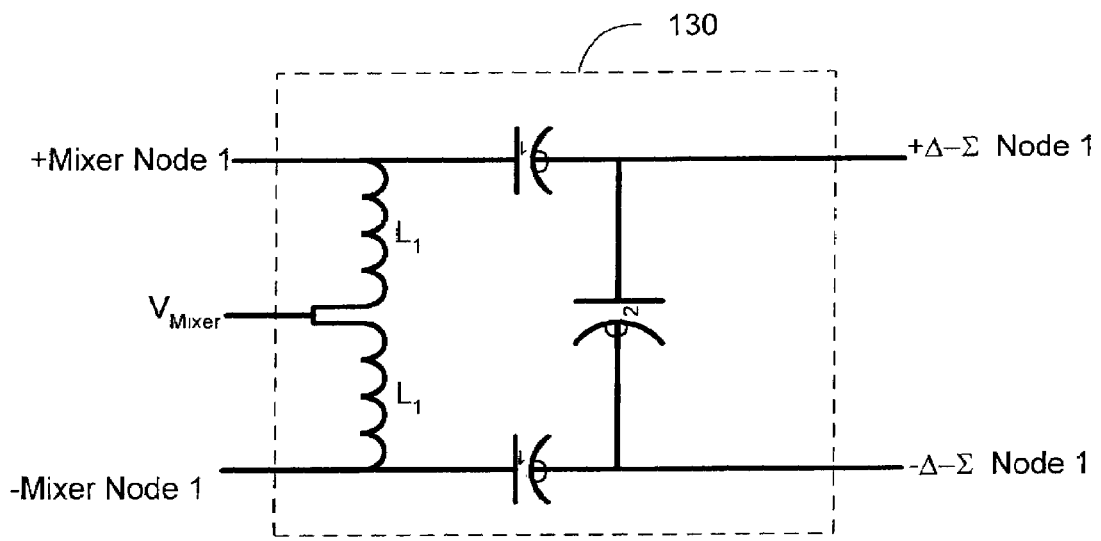
Figure 6C:
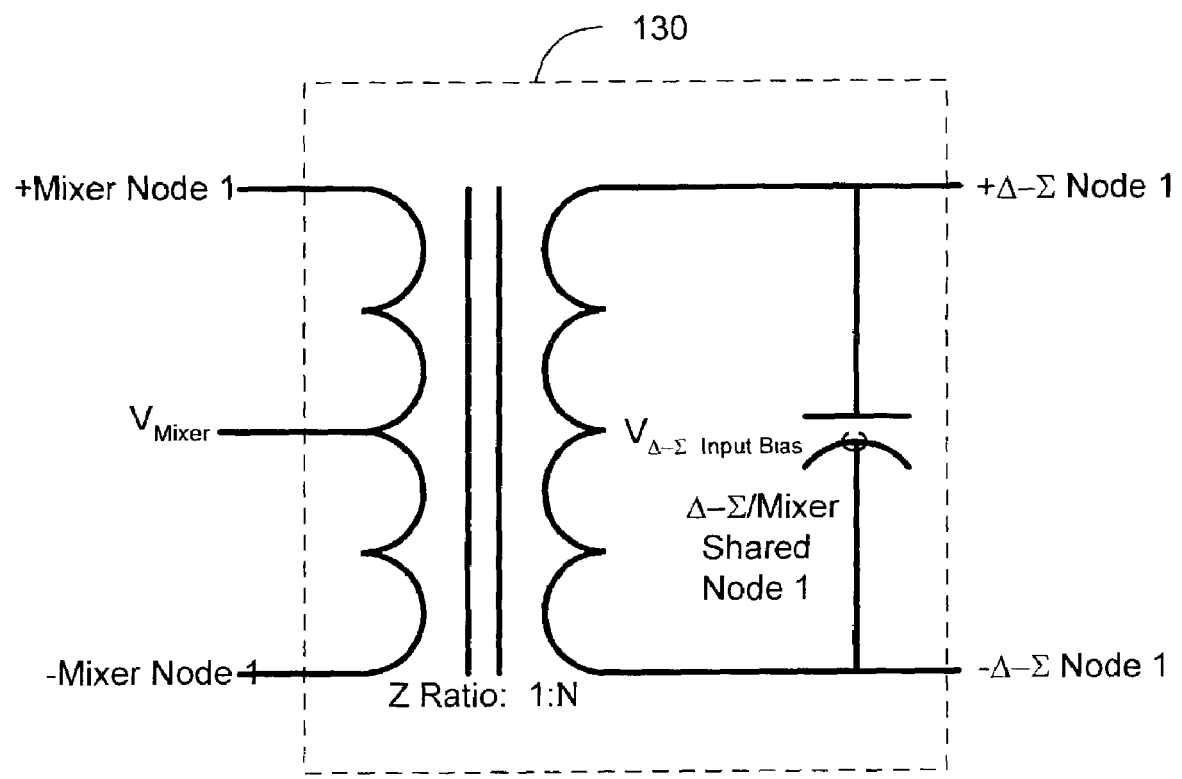

Three example options for the IF filter 130A, 130B are shown in FIGS. 6A to 6C, which are discussed in further detail later. In one embodiment, the delta-sigma modulator 140A (140B) includes a lowpass filter (shown in FIG. 7 in the example form of a capacitor C2) for a follow-on Node (or Nodes) within the delta-sigma modulator 140A (140B). The bandpass filters 130A and 130B of Node 1 and the lowpass filter for the follow-on Node result in both a signal transfer function (STF) and noise transfer function with a bandpass transfer function centered at the IF frequency. This provides rejection of DC and 1/f noise components from the respective mixer 120A and 120B and also provides IF pre-filtering to attenuate signals outside of the channel bandwidth of the desired signal.

Each delta-sigma modulator 140A and 140B converts the input signal at the respective IF filter 130A and 130B into a one-bit data stream output sampled at a sampling rate of fDS-CLK, which corresponds to a sampling period of TS=1/fDS-CLK, and which is derived from the VCO 180 as an integer sub-multiple of the local oscillator frequency, fLO. Alternatively, a separate clock may be used to derive fDS-CLK. In the preferred embodiment, the implementations of the delta-sigma modulators 140A and 140B are identical and, thus, an understanding of either the I and Q paths leads directly to an understanding of the other. Each of the digital data outputs of the delta-sigma modulators 140A and 140B is preferably a one-bit data stream at the sampling rate, which is characteristic of a typical delta-sigma modulator. In this example embodiment, the output of each delta-sigma modulators 140A, 140B is coupled to a decimation filter 150A, 150B.

Each decimation filter 150A, 150B filters and decimates the output signal from the respective delta-sigma modulator 140A, 140B to form a high resolution (multi-bit) digital signal at a sampling rate of fM=fDS-CLK/MD, where MD is the decimation ratio (integer) of the decimation filter 150A, 150B. Thus, the decimation filter 150A, 150B divides down the sampling rate of the digital signal by MD. In the preferred embodiment, each decimation filter 150A and 150B has a lowpass frequency response, which is designed to filter out noise and signals outside of the bandwidth of interest.

The outputs of the decimation filters 150A and 150B are coupled to a complex translation circuit 160, which is preferably shared by the I and Q signal paths. The translation circuit 160 translates the I and Q signals 152, 154 from the decimation filters 150A, 150B respectively to baseband (zero IF) using a translation frequency that is the frequency of the complex IF, as explained further below. The I and Q outputs 162, 164 of the translation circuit 160 are then separately filtered by matched filters 170A and 170B to remove adjacent channel interference. The matched filters 170A and 170B output the I baseband data signal 172, I_Data, and the Q baseband data signal 174, Q_Data, to the modem 30, which provide a digitized baseband representation of the input RF carrier modulated signal of interest. The matched filters 170A and 170B may be clocked to the modem 30 by synchronizing the I and Q data signals with the modem clock signal 32 from the modem 30. Alternatively, the matched filters 170A and 170B may send a clock signal to the modem 30 to synchronize the modem 30 with the sampling rate of the I and Q data signals.

An understanding of an example embodiment of the improved receiver 10 can be gained with reference to FIGS. 4a through 4d. FIG. 4a is a power spectral density plot of three exemplary carrier modulated signals at the input of the receiver. In FIG. 4a, the vertical axis represents the magnitude of the power spectral density and the horizontal axis represents frequency. The three signals shown, {Sk(f), k=1, 2, 3}, include both the signal of interest, S2(f), and interference signals, S1(f) and S3(f). FIG. 4a also includes the negative frequency image components of the signals (shown in hashed shading). The local oscillation frequency, fLO, is marked on the horizontal frequency axis.

FIG. 4b is a power spectral density plot of the carrier modulated signals 152, 154 at the output of each of the I and Q decimation filters 150A and 150B in the example embodiment of FIG. 3. In FIG. 4b, the frequency of each signal has been translated downward by the local oscillation frequency, fLO, by the corresponding mixer 120A and 120B. The desired signal band, S2(f), has been translated to the intermediate frequency, fIF, where fIF=f2−fLO. In this example, interference signal S1(f) has been translated to the negative portion of the frequency axis since f1<fLO.

The dashed line shown in FIG. 4b represents the magnitude of the transfer function of each decimation filter 150A and 150B according to an example embodiment. In this example embodiment, the transfer curve is a lowpass filter that passes all three of the signals. The output of each delta-sigma modulator may include signals and interference outside the bandwidth of the signal of interest, quantization noise, translated LNA thermal noise, higher frequency (>fLO) components from the multiplying function of the mixers, and additional noise and harmonics introduced by the delta-sigma modulator, which are partially filtered out by the decimation filter 150A, 150B. As illustrated in the example of FIG. 4B, the transfer function is a lowpass filter that passes all three of the signals within its bandwidth.

Figure 4C:
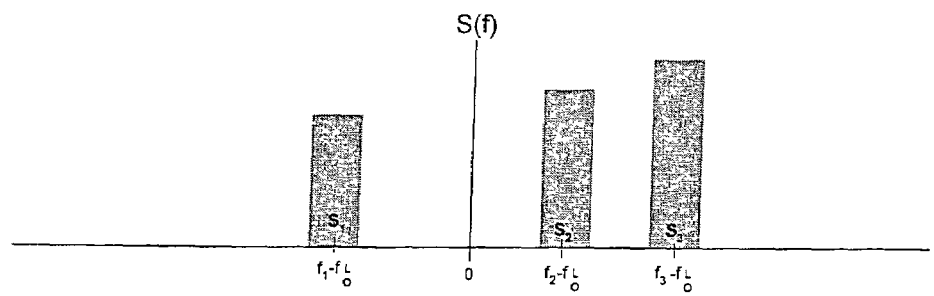

FIG. 4c is a complex power spectral density plot of the carrier modulated signals 152, 154 at the output of the I and Q decimation filters 150A and 150B in the example embodiment of FIG. 3. More particularly, FIG. 4c shows the complex spectral power densities at the output of the I and Q decimation filters 150A, 150B. The negative image components of the signals are not present in the complex power spectral densities of the signals because the rejection of the negative image components is accomplished by the I and Q paths, which allows implementation of a complex, as opposed to real, translation.

Figure 4D:
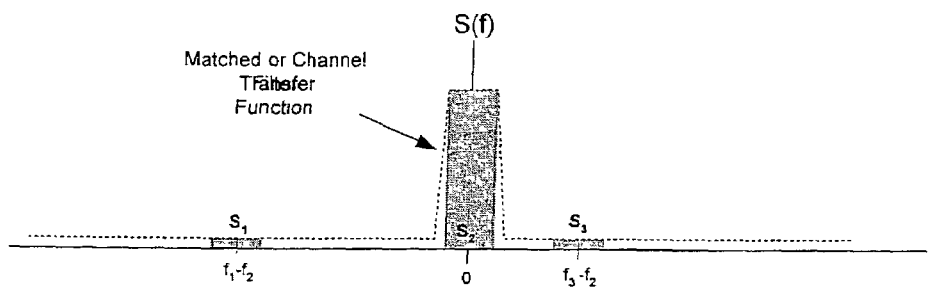

FIG. 4d is a complex power spectral density plot of the carrier modulated signals 172, 174 at the output of the matched filters 170A and 170B in the example embodiment of FIG. 3. In FIG. 4d, the frequency of each signal has been translated downward by the intermediate frequency by the translation circuit 160. The signal of interest S2(f) has been translated to baseband. The dashed line in FIG. 4d represents the magnitude of the lowpass transfer function of the matched filters 170A and 170B according to one embodiment. The decimation filter 150A, 150B passes the signal of interest, S2(f), while attenuating the interference signals S1(f) and S3(f).

Figure 5:
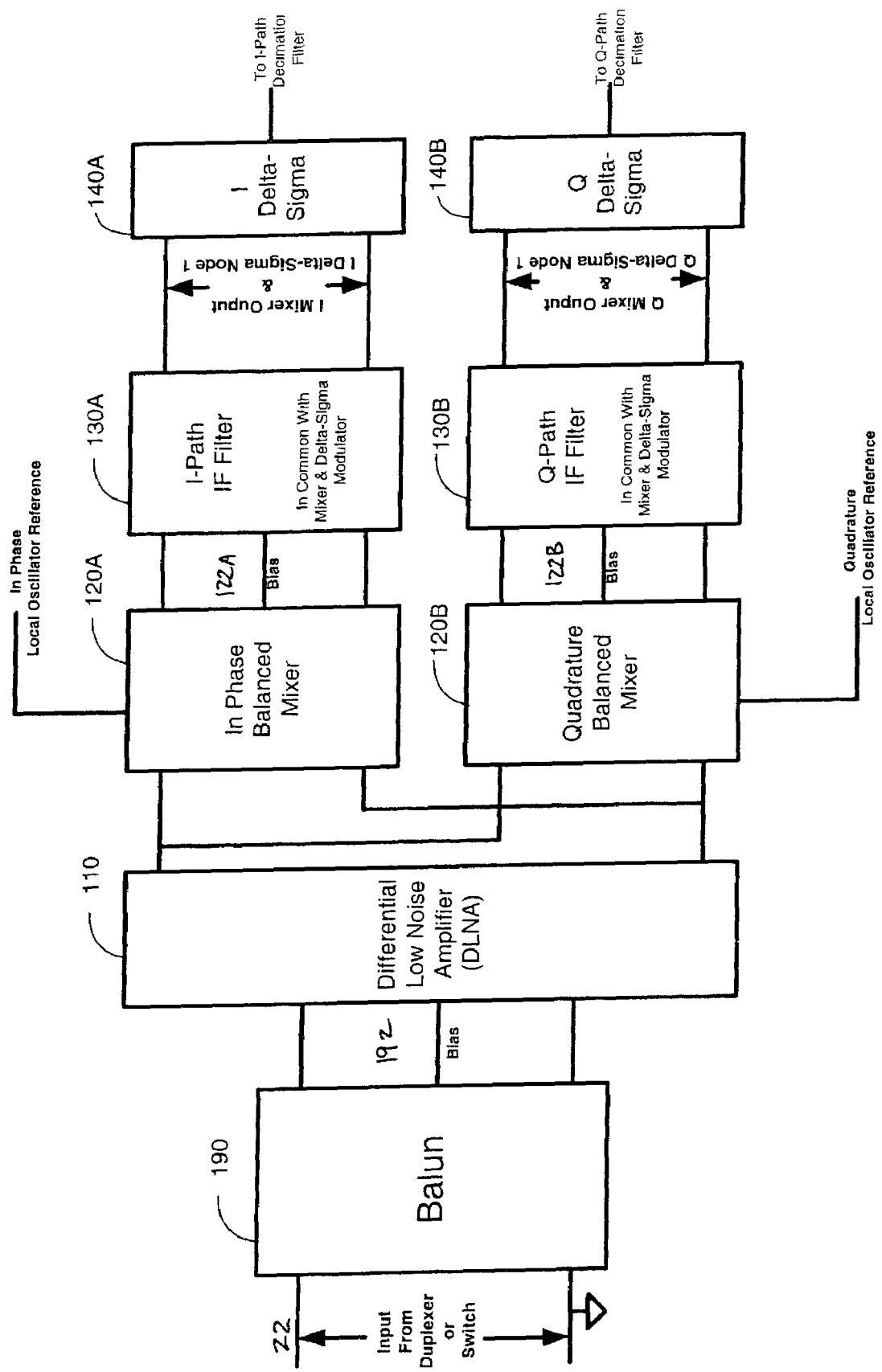
FIG. 5 is block diagram of an example embodiment of a differential receiver.

FIG. 5 shows an example embodiment of a differential implementation of the improved receiver 10. The receiver 10 preferably includes a balun 190 for converting the incoming RF signal 22 into a differential RF signal 192, and a differential low noise amplifier (DLNA) 110 for amplifying the differential RF signal 192 while minimizing the addition of noise and distortion. For low sensitivity or wide bandwidth applications, the DLNA 110 may not be necessary.

Alternatively for the dual band application, the receiver 10 may utilize one broadband DLNA 110 that that can amplify both frequency bands. Still alternatively, the receiver 10 may utilize multiple narrow band DLNAs, one for each frequency band.

The differential output of the DLNA 110 is coupled to both the in-phase mixer 120A and the quadrature mixer 120B. The in-phase mixer 120A receives a differential in-phase local oscillator signal (e.g., LO_0° and LO_180°) and the quadrature mixer 120B receives a differential quadrature local oscillator signal (e.g., LO_90° and LO_270°) from the clock generation and distribution circuit 112 (see FIG. 3). The phase angles within the parentheses indicate examples of the relative phases between the signals. The output 122 of the I mixer 120A is coupled to the I delta-sigma modulator 140A via the I-path IF filter 130A and the output 122B of the mixer 120B is coupled to the Q delta-sigma modulator 140B via the Q-path IF filter 130B. If the I and Q signal paths have equal gains and are in quadrature (90 degrees out of phase), then the RF input signal is translated to the IF frequency as illustrated in FIGS. 4b and 4c.

Figure 7:
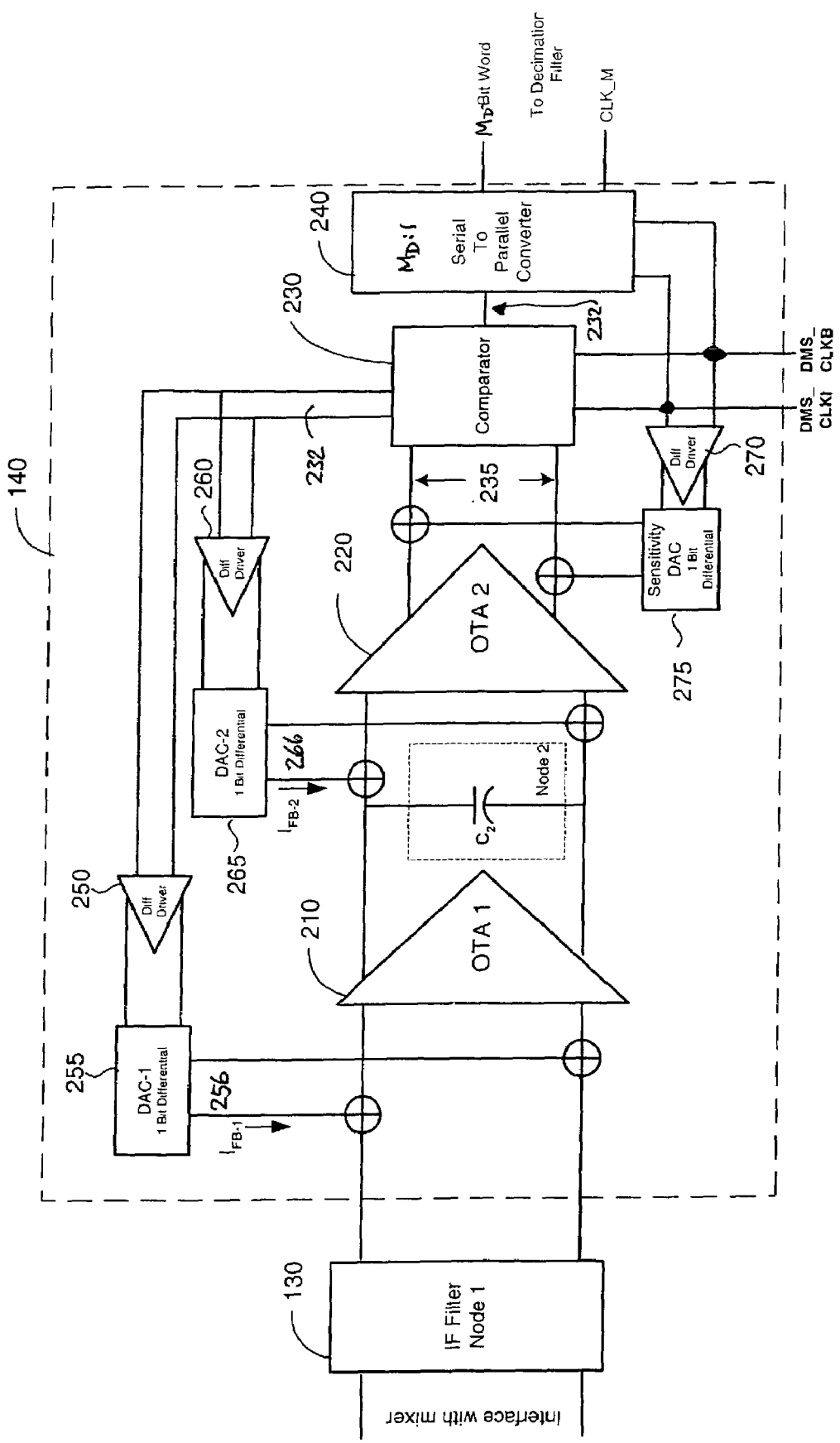
FIG. 7 illustrates an example embodiment of a delta-sigma modulator.

FIG. 7 shows an example embodiment of the delta-sigma modulator 140 (e.g., 140A or 140B) receiving input from the shared IF-filter 130 (e.g. 130A, 130B) at Node 1. The delta-sigma modulator 140 sends the output from the shared IF-filter 130 to a first operational transconductance amplifier (OTA) 210, whose output is sent to a second OTA 220, and whose output in turn is inputted to a comparator 230. The delta-sigma modulator 140 further preferably comprises a capacitor $C_2$ in parallel with the differential output of the first OTA 210 and the differential input of the second OTA 220. The capacitor $C_2$ establishes a pole at zero frequency, forming a lowpass filter at Node 2 of the delta-sigma modulator 140. The delta-sigma modulator 140 further preferably comprises a sensitivity DAC circuit 275 or synchronous dither, which is designed to eliminate the effects of hysteresis and offset at the comparator input. A detailed description of the sensitivity circuit 275 will be given later.

The first OTA 210 converts the differential voltage at its input (Node 1) into a differential current equal to the input differential voltage multiplied by the transductance of the first OTA 210. The output differential current of the first OTA 210 is converted into a voltage by the capacitor $C_2$. The second OTA 220 converts the differential voltage at its input (Node 2) into a differential current equal to the input differential voltage multiplied by the transductance of the second OTA 220. The comparator 230 receives the output of the second OTA 230 at its input 235 and a differential sampling clock DMS_CLK (composed of DMS_CLKI and DMS_CLKB) at a rate that is equal to, a harmonic, or a sub-harmonic of the local oscillator frequency $f_{LO}$. The comparator 230 compares the signal level at its input 235 to a predetermined threshold for each cycle of the sampling clock DMS_CLK. The comparator 230 outputs a logic value one when the signal level is above the threshold value and outputs a logic value zero when the signal level is below the threshold value. The comparator 230 may have a resistive input load, impedance, or capacitive load, or a combination of any of these, that converts the output current of the second OTA 220 into a voltage that can be compared to a voltage threshold value. The binary output of the comparator 230 provides a one-bit data stream 232 that is a digital representation of the input signal to the delta-sigma modulator 140 and is sampled at a rate of DMS_CLK. The one-bit data stream 232 is inputted to a demultiplexer 240, which converts the one-bit data stream 232 into parallel digital words whose length matches the decimation ratio $M_D$ of the decimation filter. This allows the high speed 1-bit output of the delta-sigma modulator 140 to be inputted to the decimation filter 150A, 150B at a reduced rate equal to $1/M_D$.

The binary output 232 of the comparator 230 also controls two feedback 1-bit digital-to-analog converters (DACs) 255 and 265 via differential drivers 250 and 260, respectively. Each feedback DAC 255 and 265 outputs one of two differential analog currents 256, 266 respectively depending on the logic value of the output 232 of the comparator 230. Thus, the outputs 256, 266 of the feedback DACs 255 and 265 provide analog representations of the output of the comparator 230, which are fed back to Nodes 1 and 2 of the delta-sigma modulator 140, respectively. Preferably, this feedback is negative so that it provides noise shaping that pushes the quantization noise power associated with the comparator 230 to higher frequencies above the signal band of interest, thereby reducing the quantization noise power within the signal band of interest.

In a preferred embodiment, the IF-filter 130 is a resonator, such as one of the three resonators shown in FIGS. 6A to 6C. An innovation of the delta-sigma modulator 140 according to this embodiment is its use of a resonator shared with the output of the mixer 120A/120B as shown in FIG. 5. The shared resonator reduces loses associated with interfacing the output of the mixer 120A/120B to the input of the delta-sigma modulator 140. Further, the resonator provides a bandpass filter at the IF frequency prior to sampling the signal, thereby further reducing the effects of out-of-bound signals on the dynamic range and aliasing of the digitization process. Additional filtering for the remaining portions of the delta-sigma modulator 140 can be implemented either as a lowpass or bandpass filter; although the additional filter is implemented as a lowpass filter formed by capacitor $C_2$ in the embodiment shown in FIG. 7.

The resonator of the IF filter 130 provides a resonator function in parallel with the input of the first OTA 210 and capacitor $C_2$ provides an integration function in parallel with the output of the first OTA 210 and the input of the second OTA 220. Implementing the integration and resonator functions of the delta-sigma modulator 140 in parallel with the input and output of the OTAs 210 and 220 shown in FIG. 7, instead of the more conventional feedback approach, reduces the bandwidth and dynamic range requirements of the OTAs 210 and 220. This is because both the feedback from the DACs 255 and 265 and the input signal path are filtered by the bandpass and lowpass characteristics of the IF filter 130 resonator and capacitor $C_2$, respectively.

Referring back to FIGS. 6A to 6C, the resonators can also function to DC bias the output of the mixers 120A/120B. This advantageously eliminates the need to provide a separate DC bias circuit to bias the output of the mixers 120A/120B. Each of the resonators in FIGS. 6A to 6C couples a DC voltage bias, $V_{mixer}$, to the differential output of the corresponding mixer 120A/120B through inductors, e.g., $L_1$. Because the inductors $L_1$ act as approximate DC shorts, there is minimal DC drop across the inductors and $V_{mixer}$ is applied to the differential output of the mixer 120A/120B with minimal DC loss.

Turning to FIG. 7 again, the sensitivity DAC circuit 270 will now be described in greater detail. The input of the sensitivity DAC circuit 270 is coupled to the sampling clock DMS_CLK via a differential driver 270. The output of the sensitivity DAC circuit 275 is coupled to the input 235 of the comparator 230. The sensitivity DAC circuit 275 preferably outputs one of two differential output currents depending on whether the state of the clock DMS_CLK is high or low. Because the clock DMS_CLK switches between the high and low state every clock cycle, the clock DMS_CLK switches the sensitivity DAC circuit 275 between its two output currents at a rate that is synchronous with DMS_CLK. This current switching, which is inputted to the comparator 230, maintains continuous triggering of the comparator 230, thereby avoiding dead zones at low input signal levels. Because the sensitivity DAC circuit 275 is switched using the clock DMS_CLK, the sensitivity DAC circuit is synchronous with the sampling rate of the delta-sigma modulator 140. This prevents the switching of the sensitivity DAC circuit 275 from creating tones in the signal band of interest. Alternatively, the clock DMS_CLK divided by an integer can be used to switch the sensitivity DAC circuit 275 as long as the integer is sufficiently small so that the frequency of the resultant tone does not fall within the signal band of interest.

Figure 8:
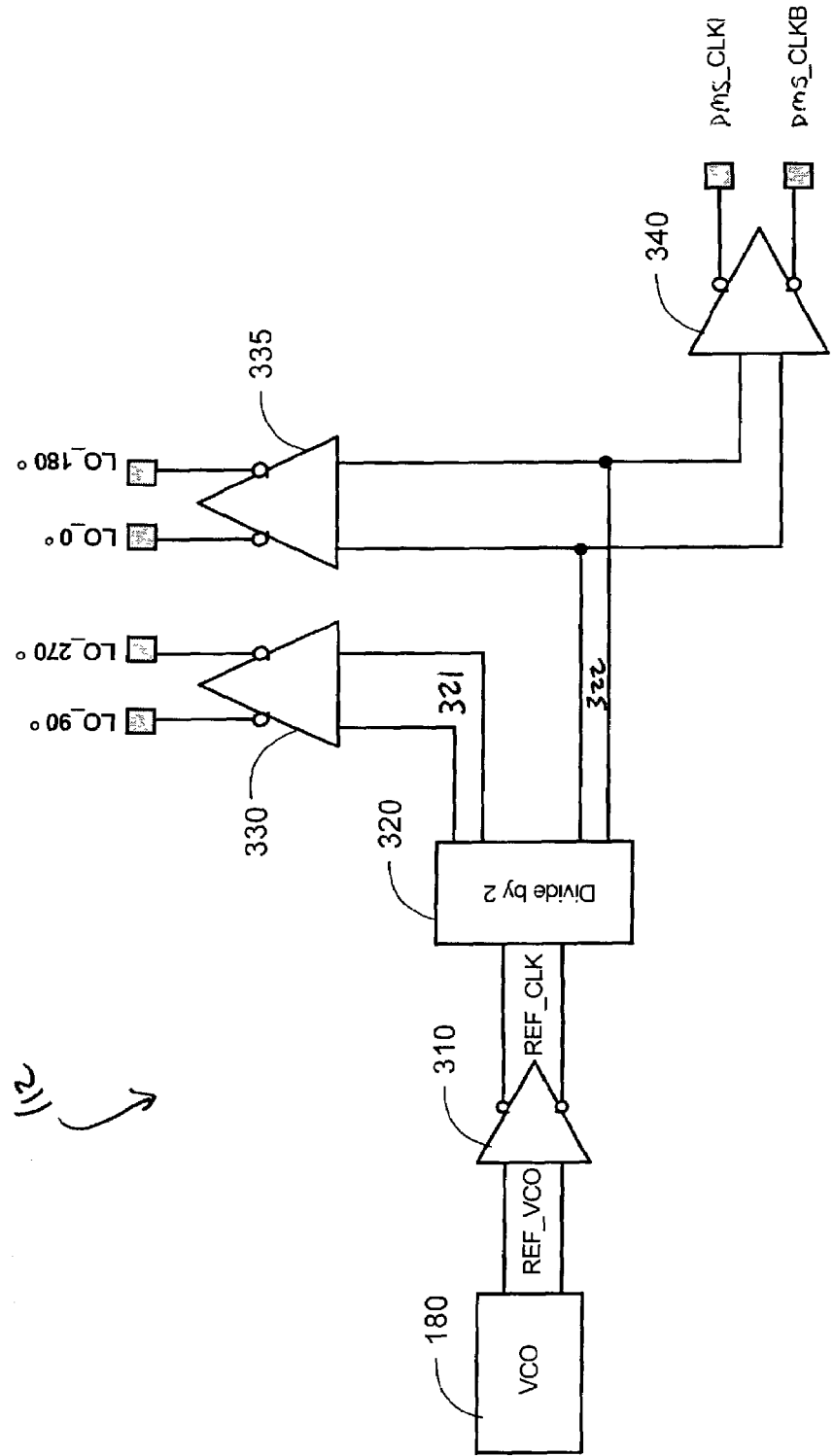
FIG. 8 illustrates an example embodiment of a clock generation and distribution circuit.

FIG. 8 shows an example embodiment of a clock generation and distribution circuit 112 for providing the in-phase and quadrature differential local oscillation signals (e.g., LO_0° and LO_180°) and (e.g., LO_90° and LO_270°) to the I and Q mixers 120A and 120B, respectively. The clock generation and distribution circuit 112 also provides the sampling clock DMS_CLK to the I and Q delta-sigma modulators 140A and 140B as a differential signal comprising DMS_CLKI and DMS_CLKB. Although the clock signals are differential in the preferred embodiment, non-differential clock signals may be used in any of the embodiments described in this disclosure.

The clock generation and distribution circuit 112 preferably comprises a voltage control oscillator VCO 180 for outputting a sinusoidal signal REF_VCO of frequency $f_{VCO}$, and a reference amplifier 310 for converting the VCO output into a clock signal REF_CLK of frequency $f_{VCO}$. The frequency of REF_CLK is then divided by 2 by a frequency divider 320. A first differential output 321 of the frequency divider 320 is inputted to a first LO amplifier 330 to provide the I differential local oscillation signals (e.g., LO_0° and LO_180°) and a second differential output 322 is inputted to a second LO amplifier 335 to provide the Q differential local oscillation signal (e.g., LO_90° and LO_270°). The second differential output 322 of the frequency divider 320 is also inputted to a third amplifier 340 to provide the differential sampling clock (DMS_CLKI and DMS_CLKB). In this example embodiment, all of the outputs of the clock generation and distribution circuit 112 have a frequency of $f_{VCO}/2$.

In the dual band application of the receiver, the two inputs 321, 322 to the LO amplifiers 330, 335 is preferably further frequency divided by 2 so that $f_{LO}=f_{VCO}/4$. Although the implementation of FIG. 8 is included explicitly herein for illustration, a variety of other means can be used to generate the clock signals.

Figure 9:
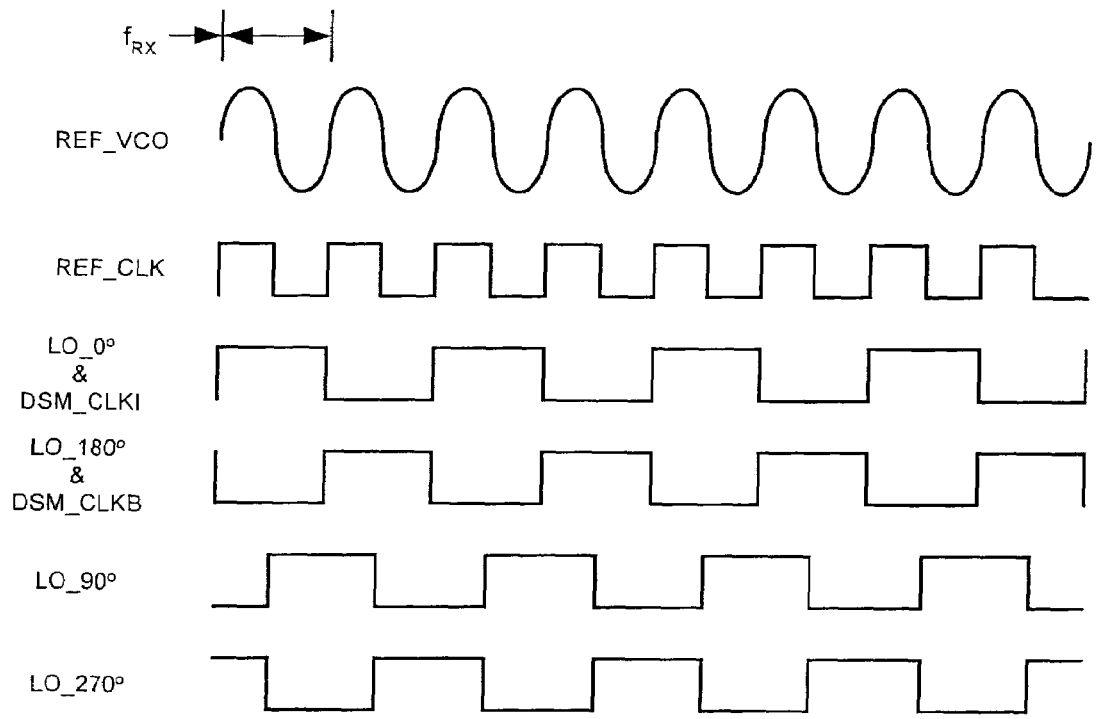
FIG. 9 illustrates example timing waveforms for the clock generation and distribution circuit of FIG. 8.

FIG. 9 illustrates example waveforms for the clock generation and distribution circuit 112. Note that the local oscillator signals LO_0° and LO_90° are 90 degrees out of phase. The frequency divider 320 achieves this by changing the state of local oscillator signal LO_0° on the rising edges of the reference clock REF_CLK and changing the state of local oscillator signal LO_90° on the falling edges of the reference clock REF_CLK, as shown in FIG. 9.

In a preferred embodiment, the local oscillator frequency $f_{LO}$ is set to a value of $$f_{LO} = \frac{f_{CH}}{[1+(M_D \times M_T)^{-1}]} \quad \text{(Eq. 1)}$$

where $f_{LO}$=Frequency of the local oscillator reference (from the VCO);

$f_{CH}$=Center frequency of the center of the desired signal channel;

$M_D$=Decimation ratio (integer) of the decimation filter;

$M_T$=Translation ratio (integer) of the translation circuit;

so that the intermediate frequency, $f_{IF}$, is equal to:

$$f_{IF} = f_{CH} - f_{LO} = \frac{f_{LO}}{(M_D \times M_T)} \quad \text{(Eq. 2)}$$

Thus, the intermediate frequency is equal to the local oscillator frequency, $f_{LO}$, divided by the integer of ($M_D \times M_T$). For example, if $f_{LO}$=1960 MHz, $M_D$=96, $M_T$=8, then $f_{IF}$=2.5520 MHz. As will be explained later, the proper selection of $M_D$ and $M_T$ can significantly simplify the implementation of the translation circuit 160 that translates the IF frequency to baseband. To further simplify the second translation, $M_T$ can be selected as a multiple of four, which is also explained later.

Thus, the output of the frequency synthesizer VCO 180 is used to provide both the local oscillator signals for the I and Q mixers 120A, 120B and the sampling clock for the I and Q delta-sigma modulators 140A, 140B. The frequency of the VCO 180 may be tuned in order to tune the receiver 10 to receive RF signals at different center frequencies. For example, the receiver 10 may be tuned to a desired center frequency, $f_{CH}$, by tuning the VCO 180 in accordance with Equations (1) and (2) so that the local oscillator frequency, $f_{LO}$, translates the desired center frequency, $f_{CH}$, to the intermediate frequency, $f_{IF}$, of the receiver 10.

The decimation filters 150A and 150B will now be discussed in greater detail. Each decimation filter 150A and 150B receives a MD-bit data word from the output of the $M_D$:1 serial to parallel converter 240 of each delta sigma modulator 140A and 140B at a sampling rate of CLK_M, where the $M_D$-bit data word consists of $M_D$ consecutive 1-bit outputs 232 from the comparator 230. CLK_M is generated by dividing the rate at which DMS_CLK is sampled by $M_D$. The decimation filters 150A and 150B both filters and decimates the one-bit data stream to produce a multi-bit digital signal at a sampling rate of clock CLK_M=DMS_CLK divided by $M_D$. Importantly the decimation clock CLK_M is synchronized to an integer sub-multiple of the local oscillator frequency. In the preferred embodiment, the decimation filters 150A and 150B have a lowpass frequency response that is designed to filter out noise and signals outside of the bandwidth of interest. The decimation filters 150A and 150B are designed to reduce these undesirable signals and noise to sufficient levels that they will not alias back into the bandwidth of interest when the sampling rate is decimated by $M_D$. Typically, the decimation filters 150A and 150B are implemented with a finite impulse response (FIR) filter whose length is an integer multiple of $M_D$ and whose characteristics are modified by changing the value of the filter coefficients. Alternatively, the decimation filters can be implemented by infinite impulse response filters. For the decimation filters 150A and 150b, there will be a slight change in the filter response, primarily in the passband characteristic, as the signal channel is turned over the band, e.g., as the sampling frequency of the delta-sigma modulator 140A and 140b changes. The outputs from the decimation filters 150A and 150B are coupled to the complex translation circuit 160.

Figure 10:
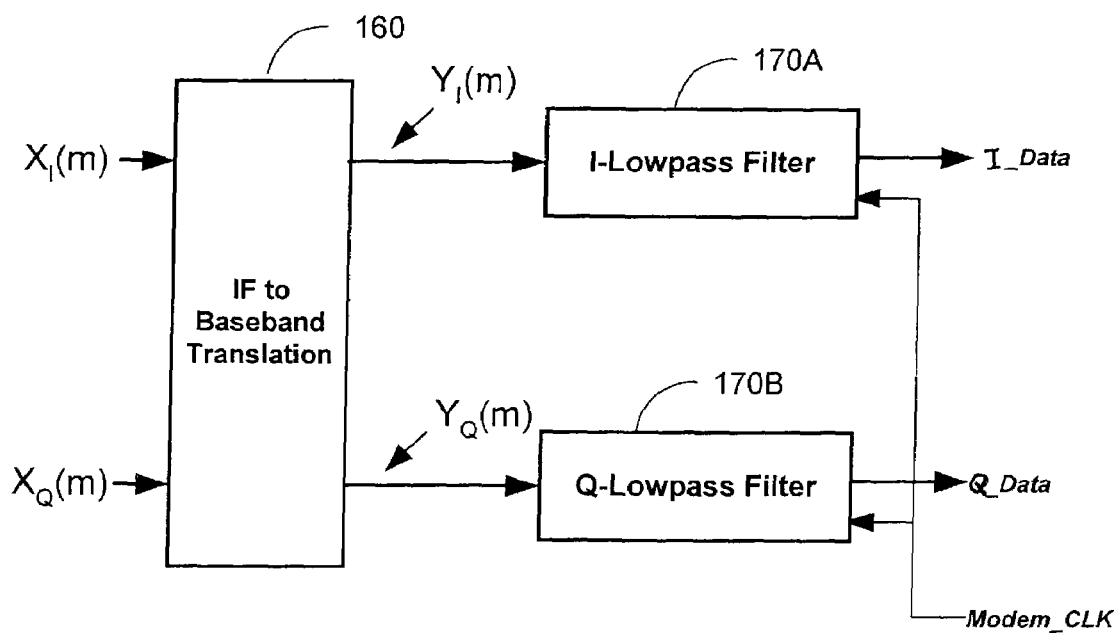
FIG. 10 illustrates an example embodiment of a complex translation circuit and low pass filters.

The complex translation circuit 160 will now be described in greater detail with reference to FIG. 10. The complex translation circuit 160 receives data signals $X_I(m)$ and $X_Q(m)$ from the I and Q decimation filters 150A and 150B, respectively, at the sampling rate of CLK_M, where m denotes a sample number. Together, the data signals $X_I(m)$ and $X_Q(m)$ form a complex signal X(m) given by $$X(m) = X_I(m) \times j X_Q(m) \quad \text{(Eq. 3)}$$

where j is $\sqrt{-1}$.

The complex signal X(m) can be translated from the intermediate frequency, $f_{IF}$, to a baseband complex signal Y(m) according to the following equation $$Y(m) = X(m) \times e^{-j\omega_{IF}t} \quad \text{(Eq. 4)}$$

where $\omega_{IF} = 2\pi \times f_{IF}$ is the angular frequency of the intermediate frequency and t is time. The time can be expressed as $t = T_m \times m$, where $T_m$ is the sampling period of the incoming digital signals from the decimation filters 150A and 150B and is equal to $T_m = 1/f_{CLK\_M}$, where $f_{CLK\_M}$ is the frequency of clock CLK_M. Y(m) can therefore be rewritten as $$Y(m) = X(m) \times e^{-j(2\pi \times f_{IF} \times T_m \times m)} \quad \text{(Eq. 5)}$$

Rewriting Y(m) in terms of its I and Q components results in $$Y_I(m) + jY_Q(m) = [X_I(m) + jX_Q(m)] \times [\cos(2\pi \times f_{IF} \times T_m \times m) - j\sin(2\pi \times f_{IF} \times T_m \times m)] \quad \text{(Eq. 6)}$$

Multiplying out the terms in Equation 6 and separating the I and Q components of Y(m) results in $$Y_I(m) = X_I(m)\cos(2\pi \times f_{IF} \times T_m \times m) + X_Q(m)\sin(2\pi f_{IF} \times T_m \times m) \quad \text{(Eq. 7)}$$

$$Y_Q(m) = -X_I(m)\sin(2\pi \times f_{IF} \times T_m \times m) + X_Q(m)\cos(2\pi \times f_{IF} \times T_m \times m) \quad \text{(Eq. 8)}$$

In the preferred embodiment, the complex translation circuit 160 translates the data signals $X_I(m)$ and $X_Q(m)$ from the decimation filters 150A and 150B to the baseband digital signals $Y_I(m)$ and $Y_Q(m)$ in accordance with Equations 7 and 8. The translation circuit 160 may be implemented, for example, with multipliers and adders.

The selection of the translation ratio $M_T$ can simplify the implementation of the translation circuit 160. This can be demonstrated by rewriting Equations 7 and 8 in terms of $M_T$. When the clock DMS_CLK equals the local oscillator frequency, $f_{LO}$, Equations 7 and 9 can be rewritten as $$Y_I(m) = X_I(m)\cos\left(\frac{2\pi \times m}{M_T}\right) + X_Q(m)\sin\left(\frac{2\pi \times m}{M_T}\right) \quad \text{(Eq. 9)}$$

$$Y_Q(m) = -X_I(m)\sin\left(\frac{2\pi \times m}{M_T}\right) + X_Q(m)\cos\left(\frac{2\pi \times m}{M_T}\right) \quad \text{(Eq. 10)}$$

Selecting $M_T$ as a multiple of four simplifies the implementation of the translation circuit 160 by reducing set of values for the Sin and Cos terms. For example, when $M_T$=4, Equations 9 and 10 can be rewritten as $$Y_I(m) = X_I(m)\cos\left(\frac{\pi}{2} \times m\right) + X_Q(m)\sin\left(\frac{\pi}{2} \times m\right) \quad \text{(Eq. 11)}$$

$$Y_Q(m) = X_I(m)\sin\left(\frac{\pi}{2} \times m\right) + X_Q(m)\cos\left(\frac{\pi}{2} \times m\right) \quad \text{(Eq. 12)}$$

Because the sample number, m, is an integer, the expression within the Sin and Cos terms is an integer multiple of $\pi/2$. For the first four samples, m=1, 2, 3, 4, the sequence of values for the Sin and Cos terms are as follows Sin: 1, 0, −1, 0

Cos: 0, 1, 0, 1

For subsequent samples, the above sequence of values are repeated every four samples. As a result, the translation circuit 160 does not need to do multiplication to realize each of the Sin and Cos terms, thereby simplifying the implementation of the translation circuit 160. The translation can also be implemented with other integer values of $M_T$.

The I and Q outputs of the complex translation circuit 160 are each inputted to a lowpass filter 170A and 170B that functions as a signal channel filter or matched filter. As with the decimation filter 150A and 150B, there will be a slight change in the transfer function characteristic as the signal channel is tuned over the band, e.g., as the sampling frequency of the IF delta-sigma modulator 140A and 140B changes.

Figure 11A:
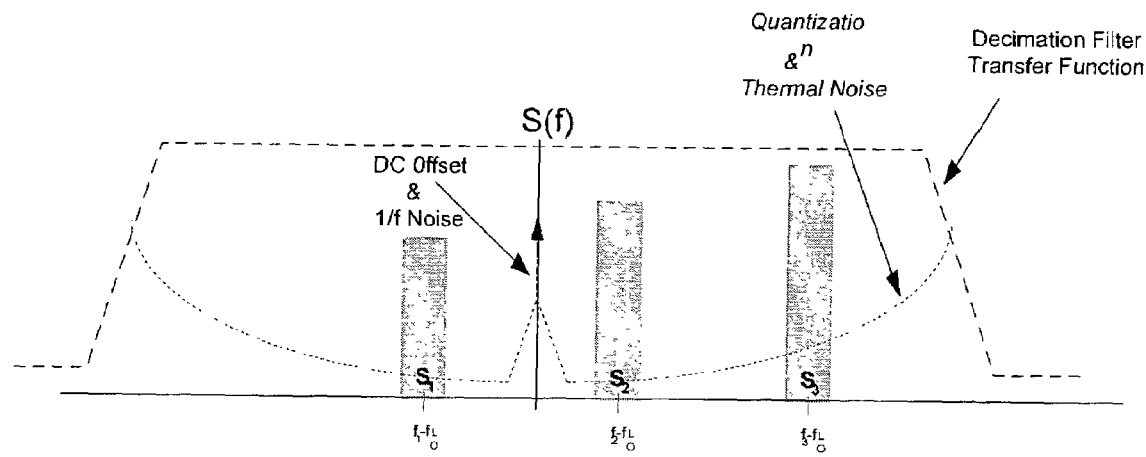
FIGS. 11A–11C are complex spectral power density plots illustrating signals at various points in the receiver.

The translation circuit 160 and the lowpass filters 170A and 170B can significantly reduce the effects of DC offset in the system and 1/f noise. This can be demonstrated with reference to FIGS. 11a to 11c. FIG. 11a illustrates an example complex power spectral density plot of three carrier modulated signals at the output of the decimation filters 150A and 150B, similar to the plot of FIG. 9c. As with FIG. 9c, the carrier modulated signals of FIG. 11a include the signal of interest, $S_2$, and the two interference signals, $S_1$ and $S_3$. FIG. 11a also includes DC offset and 1/f noise characterized by an increase in the spectral noise density around zero frequency. FIG. 11a further includes quantization and thermal noise characterized by an increase in the spectral noise density at higher frequencies.

Figure 11B:
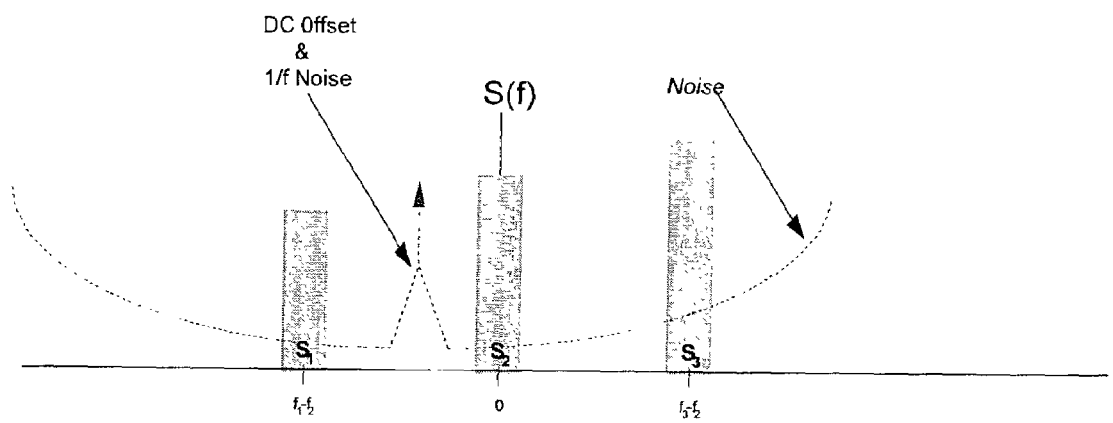

FIG. 11b illustrates an example complex power spectral plot of the signals at the output of the translation circuit 160. The translation circuit 160 translates the signals downward by the intermediate frequency. The desired signal, $S_2$, is translated to baseband. The translation circuit 160 also translates the DC offset and noise by the intermediate frequency.

Figure 11C:
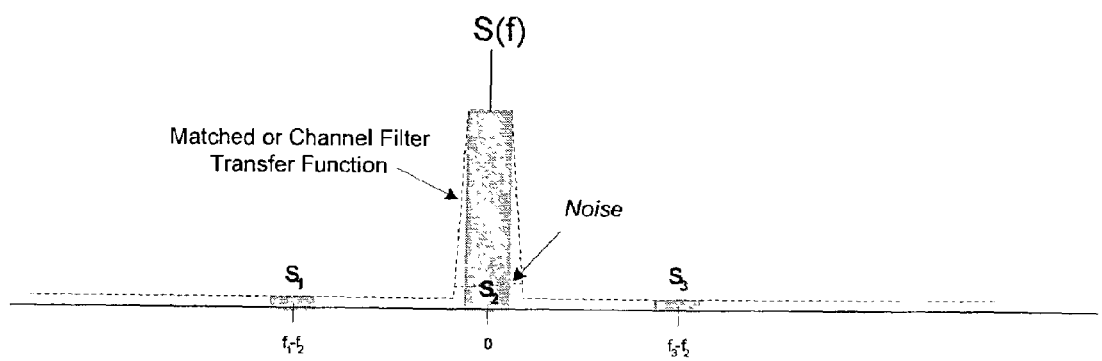

FIG. 11c illustrates an example complex power spectral plot of the signals at the output of the lowpass filters 170A and 170B. The dashed line in FIG. 11c represents the lowpass transfer curve of the lowpass filters 170A and 170B. The lowpass transfer curve passes the signal of interest, $S_2$, while attenuating the DC offset, the noise and the interference signals, $S_1$ and $S_3$.

In the foregoing specification, the invention has been described with reference to specific embodiments thereof. It will, however, be evident that various modifications and changes may be made thereto without departing from the broader spirit and scope of the invention. For example, the reader is to understand that the specific ordering and combination of process actions described herein is merely illustrative, and the invention can be performed using different or additional process actions, or a different combination or ordering of process actions. For example, each feature of one embodiment can be mixed and matched with other features shown in other embodiments. Features and processes known to those of ordinary skill in the art of receiver design may similarly be incorporated as desired. Additionally and obviously, features may be added or subtracted as desired. Accordingly, the invention is not to be restricted except in light of the attached claims and their equivalents.

What is claimed is:

1. A receiver comprising:
    an in-phase mixer configure to translate an incoming signal to an in-phase intermediate frequency signal;
    an in-phase delta-sigma modulator configured to convert the in-phase intermediate frequency signal into an in-phase digital signal at a predetermined sampling rate;
    an in-phase decimation filter configured to decimate the in-phase digital signal;
    a quadrature mixer configured to translate an incoming signal to an quadrature intermediate frequency signal;
    a quadrature delta-sigma modulator configured to convert the quadrature intermediate frequency signal into a quadrature digital signal at a predetermined sampling rate; wherein the quadrature delta-sigma modulator is configured to operate independent of the output of the in-phase delta-sigma modulator and the in-phase delta-sigma modulator is configured to operate independent of the output of the quadrature delta-sigma modulator;
    a quadrature decimation filter configured to decimate the quadrature digital signal;
    a translation circuit configured to translate the decimated in-phase and quadrature digital signals to in-phase and quadrature baseband digital signals; and
    a voltage controlled oscillator;
    wherein each of the in-phase and quadrature mixers translates the incoming signal by a local oscillator frequency of $f_{LO}$ derived from the voltage controlled oscillator; and
    the sampling rate of each of the in-phase and quadrature delta-sigma modulators is derived from the voltage controlled oscillator and equal to an integer sub-multiple of $f_{LO}$; and
    wherein each of the in-phase and quadrature intermediate frequency signals has an intermediate frequency equal to $f_{LO}$ divided by an integer that is a function of a decimation ratio of the each of the in-phase and quadrature decimation filters.

2. The receiver of claim 1, further comprises:
    an in-phase bandpass filter interfacing the in-phase mixer to the in-phase delta-sigma modulator; and
    a quadrature bandpass filter interfacing the quadrature mixer to the quadrature delta-sigma modulator.

3. The receiver of claim 2, wherein each of the in-phase and quadrature bandpass filters comprises a resonator.

4. The receiver of claim 1, wherein the translation circuit has a translation ratio that is a multiple of four.

5. The receiver of claim 1, wherein each of the in-phase and the quadrature decimation filters has a lowpass frequency response.

6. The receiver of claim 1, wherein each of the in-phase and quadrature delta-sigma modulators further comprises:
    an amplifier circuit configured to amplify the respective intermediate signal; and
    a comparator configured to convert the respective amplified intermediate signal into the respective digital signal at the sampling rate.

7. A receiver comprising:
    an in-phase mixer configured to translate an incoming signal to an in-phase intermediate frequency signal;
    an in-phase delta-sigma modulator configured to convert the in-phase intermediate frequency signal into an in-phase digital signal at a predetermined sampling rate;
    an in-phase decimation filter configured to decimate the in-phase digital signal;

a quadrature mixer configured to translate the incoming signal to a quadrature intermediate frequency signal;

a quadrature delta-sigma modulator configured to convert the quadrature intermediate frequency signal into a quadrature digital signal at the predetermined sampling rate, wherein the quadrature delta-sigma modulator is configured to operate independent of the output of the in-phase delta-sigma modulator and the in-phase delta-sigma modulator is configured to operate independent of the output of the quadrature delta-sigma modulator;

a quadrature decimation filter configured to decimate the quadrature digital signal; and a translation circuit configured to translate the decimated in-phase and quadrature digital signals to in-phase and quadrature baseband digital signals;

wherein each of the in-phase and quadrature mixers translates the incoming signal by a local oscillator frequency of $f_{LO}$ set to a value of $$f_{LO} = \frac{f_{CH}}{[1 + (M_D \times M_T)^{-1}]}$$

where $f_{CH}$ is a center frequency of the incoming signal, $M_D$ is a decimation ratio of each of the in-phase and quadrature decimation filters, and $M_T$ is a translation ratio of the translation circuit.

8. The receiver of claim 7, wherein each of the in-phase and quadrature intermediate frequency signals has an intermediate frequency equal to $$f_{IF} = \frac{f_{LO}}{(M_D \times M_T)}$$

where $f_{IF}$ is the intermediate frequency, $M_D$ is a decimation ratio of each of the in-phase and quadrature decimation filters, and $M_T$ is a translation ratio of the translation circuit.

9. A receiver comprising:

an in-phase mixer configured to translate an incoming signal to an in-phase intermediate frequency signal;

an in-phase delta-sigma modulator configured to convert the in-phase intermediate frequency signal into an in-phase digital signal at a predetermined sampling rate;

an in-phase decimation filter configured to decimate the in-phase digital signal;

a quadrature mixer configured to translate the incoming signal to a quadrature intermediate frequency signal;

a quadrature delta-sigma modulator configured to convert the quadrature intermediate frequency signal into a quadrature digital signal at the predetermined sampling rate, wherein the quadrature delta-sigma modulator is configured to operate independent of the output of the in-phase delta-sigma modulator and the in-phase delta-sigma modulator is configured to operate independent of the output of the quadrature delta-sigma modulator;

a quadrature decimation filter configured to decimate the quadrature digital signal; and a translation circuit configured to translate the decimated in-phase and quadrature digital signals to in-phase and quadrature baseband digital signals;

wherein each of the in-phase and quadrature mixers translates the incoming signal by a local oscillator frequency of $f_{LO}$, and each of the in-phase and quadrature intermediate frequency signals has an intermediate frequency equal to $$f_{IF} = \frac{f_{LO}}{(M_D \times M_T)}$$

where $f_{IF}$ is the intermediate frequency, $M_D$ is a decimation ratio of each of the in-phase and quadrature decimation filters, and $M_T$ is a translation ratio of the translation circuit.

10. The receiver of claim 9, wherein $M_T$ is a multiple of four.

11. A receiver comprising:

an in-phase mixer configured to translate an incoming signal to an in-phase intermediate frequency signal;

an in-phase delta-sigma modulator configured to convert the in-phase intermediate frequency signal into an in-phase digital signal at a predetermined sampling rate;

an in-phase decimation filter configured to decimate the in-phase digital signal;

a quadrature mixer configured to translate the incoming signal to a quadrature intermediate frequency signal;

a quadrature delta-sigma modulator configured to convert the quadrature intermediate frequency signal into a quadrature digital signal at the predetermined sampling rate, wherein the quadrature delta-sigma modulator is configured to operate independent of the output of the in-phase delta-sigma modulator and the in-phase delta-sigma modulator is configured to operate independent of the output of the quadrature delta-sigma modulator;

a quadrature decimation filter configured to decimate the quadrature digital signal; and a translation circuit configured to translate the decimated in-phase and quadrature digital signals to in-phase and quadrature baseband digital signals;

wherein each of the in-phase and quadrature delta-sigma modulators further comprises;

an amplifier circuit configured to amplify the respective intermediate signal;

a comparator configured to convert the respective amplified intermediate signal into the respective digital signal at the sampling rate; and a sensitivity digital-to-analog converter (DAC) circuit configured to output a switching signal to the comparator at a switching rate that is synchronous with the sampling rate.

12. The receiver of claim 11, wherein the switching signal switches between two analog signals at the switching rate.

13. The receiver of claim 12, wherein the sensitivity DAC circuit has a digital input configured to receive a clock signal at the sampling rate and an analog output configured to output the switching signal to the comparator.

14. A receiver comprising:

an in-phase mixer configured to translate an incoming signal to an in-phase intermediate frequency signal;

an in-phase delta-sigma modulator configured to convert the in-phase intermediate frequency signal into an in-phase digital signal at a predetermined sampling rate;

an in-phase decimation filter configured to decimate the in-phase digital signal;

a quadrature mixer configured to translate the incoming signal to a quadrature intermediate frequency signal;

a quadrature delta-sigma modulator configured to convert the quadrature intermediate frequency signal into a quadrature digital signal at the predetermined sampling rate, wherein the quadrature delta-sigma modulator is configured to operate independent of the output of the in-phase delta-sigma modulator and the in-phase delta-sigma modulator is configured to operate independent of the output of the quadrature delta-sigma modulator;

a quadrature decimation filter configured to decimate the quadrature digital signal; and a translation circuit configured to translate the decimated in-phase and quadrature digital signals to in-phase and quadrature baseband digital signals;

wherein each of the in-phase and quadrature delta-sigma modulators further comprises:

an amplifier circuit configured to amplify the respective intermediate signal;

wherein the amplifier circuit comprises a first amplifier unit and a second amplifier unit, the output from the first amplifier unit being coupled with the input to the second amplifier unit; and a comparator configured to convert the respective amplified intermediate signal into the respective digital signal at the sampling rate.

15. The receiver of claim 14, wherein the in-phase and quadrature delta-sigma modulators each further comprise:

a first digital-to-analog converter having an input coupled with an output of the comparator, and an output coupled with the input to the first amplifier unit; and a second digital-to-analog converter having an input coupled with the output of the comparator, and an output coupled with the input to the second amplifier unit.

16. The receiver of claim 15, further comprising:

an in-phase bandpass filter configured to filter an output of the in-phase mixer and output the filtered signal to the input to the first amplifier unit of the in-phase delta-sigma modulator; and a quadrature bandpass filter configured to filter an output of the quadrature mixer and output the filtered signal to the input to the first amplifier unit of the quadrature delta-sigma modulator.

* * * * *